United States Patent
Clark et al.

(10) Patent No.: US 9,522,527 B2
(45) Date of Patent: Dec. 20, 2016

(54) DROP IMAGE SENSING

(71) Applicant: HEWLETT-PACKARD DEVELOPMENT COMPANY, L.P., Houston, TX (US)

(72) Inventors: Stephan R. Clark, Corvallis, OR (US); Alexander Govyadinov, Corvallis, OR (US); Jonathan James Mott, Corvallis, OR (US); Lorraine Theresa Widmann, Corvallis, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/027,155

(22) PCT Filed: Oct. 30, 2013

(86) PCT No.: PCT/US2013/067386
§ 371 (c)(1),
(2) Date: Apr. 4, 2016

(87) PCT Pub. No.: WO2015/065347
PCT Pub. Date: May 7, 2015

(65) Prior Publication Data
US 2016/0250848 A1     Sep. 1, 2016

(51) Int. Cl.
*B41J 2/045*     (2006.01)
*B41J 2/125*     (2006.01)
(Continued)

(52) U.S. Cl.
CPC ......... *B41J 2/04526* (2013.01); *B41J 2/04586* (2013.01); *B41J 2/125* (2013.01);
(Continued)

(58) Field of Classification Search
CPC ... B41J 2/04526; B41J 2/04586; B41J 11/008; B41J 11/0095; H01L 27/14627; H01L 27/14643; G01J 1/0403; H04N 1/00029; H04N 1/00045
See application file for complete search history.

(56) References Cited

U.S. PATENT DOCUMENTS 6,575,550 B1 *  6/2003  Steinfield ............. B41J 2/04506
                                                         347/19
6,767,088 B2    7/2004  Sarmast
(Continued)

FOREIGN PATENT DOCUMENTS

| JP | 2006240119 | 9/2006 |
| JP | 2010264649 | 11/2010 |
| WO | WO-2013154530 | 10/2013 |

OTHER PUBLICATIONS

International Searching Authority. ISA/KR. International Search Report. Date of mailing Jul. 17, 2014. Application No. PCT/US2013/067386. Filed date Oct. 30, 2013.

*Primary Examiner* — Thinh H Nguyen
(74) *Attorney, Agent, or Firm* — HP Inc-Patent Department

(57) ABSTRACT

A sensor images drops ejected from a printhead nozzle. The sensor has two parallel spaced-apart rows of imaging pixels. In one example, a lens projects an image of a drop ejected from a printhead onto the rows sequentially as the drop travels along a trajectory.

19 Claims, 8 Drawing Sheets

(51) Int. Cl.
*B41J 2/165* (2006.01)
*B41J 2/21* (2006.01)
*H01L 27/146* (2006.01)

(52) U.S. Cl.
CPC ....... *B41J 2/16579* (2013.01); *B41J 2/16585* (2013.01); *B41J 2/2142* (2013.01); *B41J 2/2146* (2013.01); *H01L 27/14627* (2013.01); *H01L 27/14643* (2013.01); *B41J 2/04561* (2013.01)

(56) References Cited

U.S. PATENT DOCUMENTS

| | | |
|---|---|---|
| 6,877,838 B2 | 4/2005 | Elgee |
| 7,735,981 B2 | 6/2010 | Vaeth |
| 8,376,506 B2 | 2/2013 | Shepherd |
| 8,449,068 B2 | 5/2013 | Govyadinov |
| 8,529,011 B2 | 9/2013 | Govyadinov |
| 2004/0109038 A1 | 6/2004 | Newsome et al. |
| 2006/0071957 A1 | 4/2006 | Shang |
| 2009/0322828 A1 | 12/2009 | Kim et al. |
| 2012/0223997 A1 | 9/2012 | Abe |

* cited by examiner

DROP IMAGE SENSING

BACKGROUND

Many printers, such as inkjet printers, operate by precisely ejecting microscopic drops of one or more substances from closely spaced nozzles of a printhead onto corresponding desired locations on a medium. The quality of the printed output resulting on the medium is dependent on proper operation of the printhead nozzles. For example, a nozzle may fail to eject drops at all. In another example, the nozzle may eject drops, but not along its intended trajectory, and as a result such drops get misplaced on the medium. These and other types of defective nozzle operations can unacceptably degrade the overall operation of the printer.

DETAILED DESCRIPTION

Figure 1A:
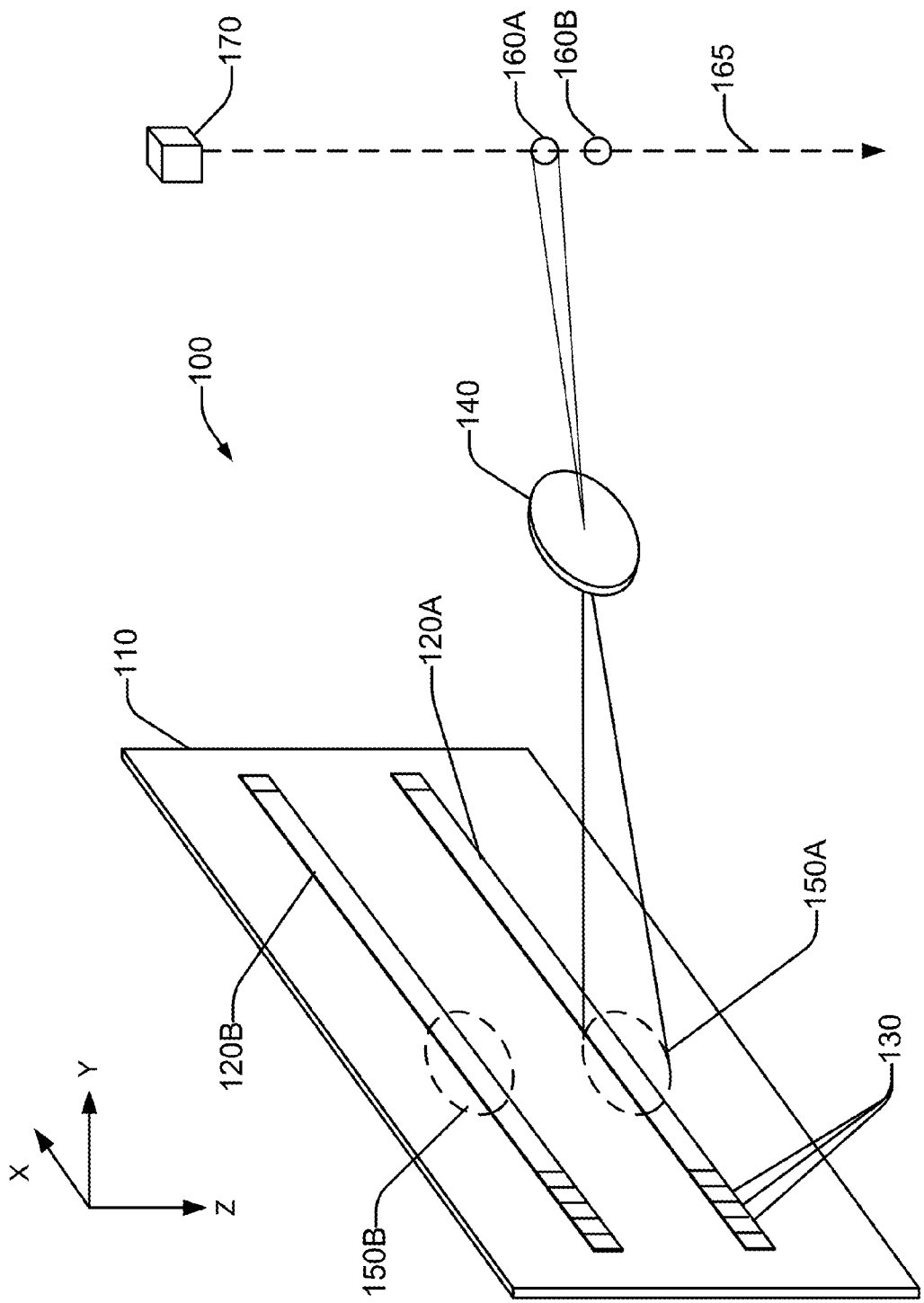
FIGS. 1A-1B are schematic representations of an imaging sensor assembly in accordance with an example of the present disclosure.

The quality of printed output produced by a printer on the print medium is dependent on proper operation of the nozzles of the printhead(s) used in the printer. The nozzles can be controllably operated to lay down drops that form an intended pattern of dots at precise locations on the print medium as the printhead(s) and/or the print medium are moved relative to each other. Various drops may be of one or more liquid substances. As defined herein and in the appended claims, a "liquid" shall be broadly understood to mean a fluid not composed primarily of a gas or gases. Such liquid substances include, but are not limited to, inks, dyes, or other colorants of various colors; finishing materials such as developers, fixers, or overcoats; and other liquids for applications other than visual arts. The print medium may be any type of suitable material that can receive the drops such as, for example paper, card stock, cloth or other fabric, transparencies, Mylar, and the like in sheet or roll form.

Excellent output quality can be achieved when the nozzles are operating properly and lay down the dots at the intended locations. However, if some nozzles of a printhead have trajectory error, drops ejected from those nozzles may not be deposited at the intended locations. In the case of image printing, the trajectory error may result in undesirable artifacts such as unprinted lines visible on the print medium, and/or differences in perceivable visual grain of the printed output.

To avoid such printing defects, it is desirable to test all the nozzles of the printhead(s) in the printer, using the printer itself. This is less expensive and complicated than having the printer print a test pattern on a sheet of paper and then sending it to an expensive high-resolution device to be scanned and the nozzle performance analyzed. It is also desirable to test the nozzles as rapidly as possible. A color inkjet printer may use one or more color inks—for example, four or six different color inks—with each different color ink being ejected from at least one logical linear array (or "slot") of individual nozzles. The number of nozzles per logical slot has been increasing due to an increase in resolution (e.g. the number of nozzles per inch), an increase in length of a logical slot, or both. A four color inkjet printer with printheads arranged in a page-wide manner may have a total of 250,000 or more nozzles. A fast way to test such a large number of nozzles for trajectory error in a relatively inexpensive manner is highly desirable.

Referring now to the drawings, there are illustrated examples of an imaging sensor, sensor assembly, printer, and method for measuring the health of printhead nozzles in-printer. An imaging sensor receives images of in-flight drops ejected from nozzles of a printhead. The sensor simultaneously images drops from multiple nozzles of a single slot (also referred to as "multiplexing"), and does this simultaneously for multiple different slots (providing a "multichannel" feature) of a printhead. A skip pattern algorithm which ensures that the various drop images captured at any point in time do not overlap on the sensor, and which tests all nozzles in a single pass of the sensor assembly with respect to the printhead, enables the health of a large number of nozzles to be measured in a comparatively fast (as much as 40 to 60 times faster than other techniques), and comparatively inexpensive, manner. As defined herein and in the appended claims, the term "nozzle health" may be broadly understood to mean one or more measures of the functional quality of a nozzle, including whether or not the nozzle is ejecting drops, and the trajectory error that the nozzle imparts to ejected drops.

Considering now the image sensor assembly in further detail, and with reference to FIGS. 1A-1B, one example image sensor assembly 100 includes a two-dimensional planar imaging sensor 110 having two parallel, spaced-apart rows 120A, 120B of imaging pixels 130 (an individual row may be referred to hereinafter as row 120). Each pixel (such as pixel 130) produces a multilevel signal (processable by a controller) that is indicative of intensity of the illumination impinging that pixel 130. The image sensor assembly 100 also includes a lens 140 that projects an image 150A, 150B of a drop 160 ejected from a nozzle 170 of a printhead onto the rows 120A, 120B sequentially as the drop 160 travels along a trajectory 165.

Drop 160A, 160B represent different positions along the trajectory 165 of the same drop. Drops ejected from a nozzle 170 of the printhead nominally travel in the Z direction (i.e. downward in FIG. 1A). Assuming that lens 140 inverts the image, drop 160A and image 150A represent the drop at a time t1, while drop 160B and image 150B represent the drop at a slightly later time t2.

The number of sensors N in each pixel row 120A, 120B may be the same for both rows or different for each row. In an example, the value of N ranges from 256 to 2048. The center-to-center spacing 184 between adjacent pixels 130 on a row 120A, 120B ranges, in one example, from 12 to 50 micrometers. This equates to a pixel resolution along the row (i.e. the X direction) of 2216 to 508 dots per inch. In one example, a completely missing line (i.e. a gap) on the printed media, along with an adjacent line printed with increased optical density, occurs where the trajectory error causes a drop placement error greater than 42 micrometers. To detect this error, a center-to-center spacing 184 of 42 micrometers, equivalent to 600 dots per inch (dpi), could be used. The length 180 of a pixel row 120A, 120B ranges, in one example, from 6 to 28 millimeters. The length 180, and the number N of pixels in a row, may depend on the size of the imaged ink drop 150 on the sensor 110 and the desired separation between imaged drops 150 on the sensor 110. One example of a commercially available part suitable for use as pixel rows 120A, 120B is a CMOS sensor, part number S10077, manufactured by Hamamatsu, having 1024 pixels and a length of 14.336 millimeters. In this sensor, each pixel 130 is 14×50 microns in size. Each pixel 130 collects the photo-induced charge, which is converted to an electrical signal and then digitized. This digitized signal is then used by a detection algorithm to locate the multiple ink drop positions, and thus their trajectories.

Each pixel 130 generates a multi-level signal that corresponds to the intensity of the illumination that impinges on it. This illumination results from the illumination of a drop at a location in the field of view which corresponds to the pixel 130 by a light source (not shown). The illumination intensity value of a pixel 130, in an example, ranges from 0 to less than 1 nanowatt.

In addition to the two pixels rows 120A, 120B, the sensor 110 may include a printed circuit assembly, that includes sensor electronics (not shown) which are coupled to the pixel rows 120A, 120B. The sensor electronics may provide a digital signal which corresponds to the multi-level illumination intensity signal to the controller for processing.

The placement of the pixel rows 120 makes the sensor 110 a two-dimensional imaging sensor of two rows by N columns. The two rows are parallel to each other and spaced apart, in one example, by a distance 182 that ranges from 1 to 4 millimeters. In another example, the distance 182 is 3 millimeters. This arrangement of two spaced-apart linear rows 120 of image pixels 130 implements a two-dimensional imaging sensor that is much less expensive than other two-dimensional imaging sensors of a size and resolution sufficient to cover the area spanned by the two rows such as, for example, a CCD or CMOS device. To calculate trajectory error, as well as other drop or nozzle metrics (such as, for example, drop velocity) that rely on measurement of the drop at two different points in time, two spaced-apart rows 120A, 120B of pixels 130 can used; the significantly larger number of rows provided at increased cost by a CCD or CMOS device, for example, is unnecessary. In addition to low cost, 1-by-N linear rows 120 of image pixels 130 operate at least M times faster than an M-by-N CCD array, and can have a one millisecond refresh rate which equates to 1000 measurements (i.e. "frames") per second. In comparison, a typical low-cost two-dimensional CCD or CMOS imaging device has a much slower 20 to 40 frames per second refresh rate, which can adversely limit drop imaging throughput in nozzle health detection applications.

The intended trajectory 165 of a drop 160 ejected from a nozzle 130 is in the Z direction. Such a drop 160 may have no trajectory component in either the X or Y directions. A drop 160 ejected from a nozzle 130 with trajectory error may have a trajectory component in the X, Y, or X and Y directions. The orientation of the sensor assembly 100 relative to the orientation of the linear logical nozzle array of the printhead 170 determines the direction (X, Y, or X+Y) in which the sensor assembly 100 measures trajectory error.

Figure 1B:
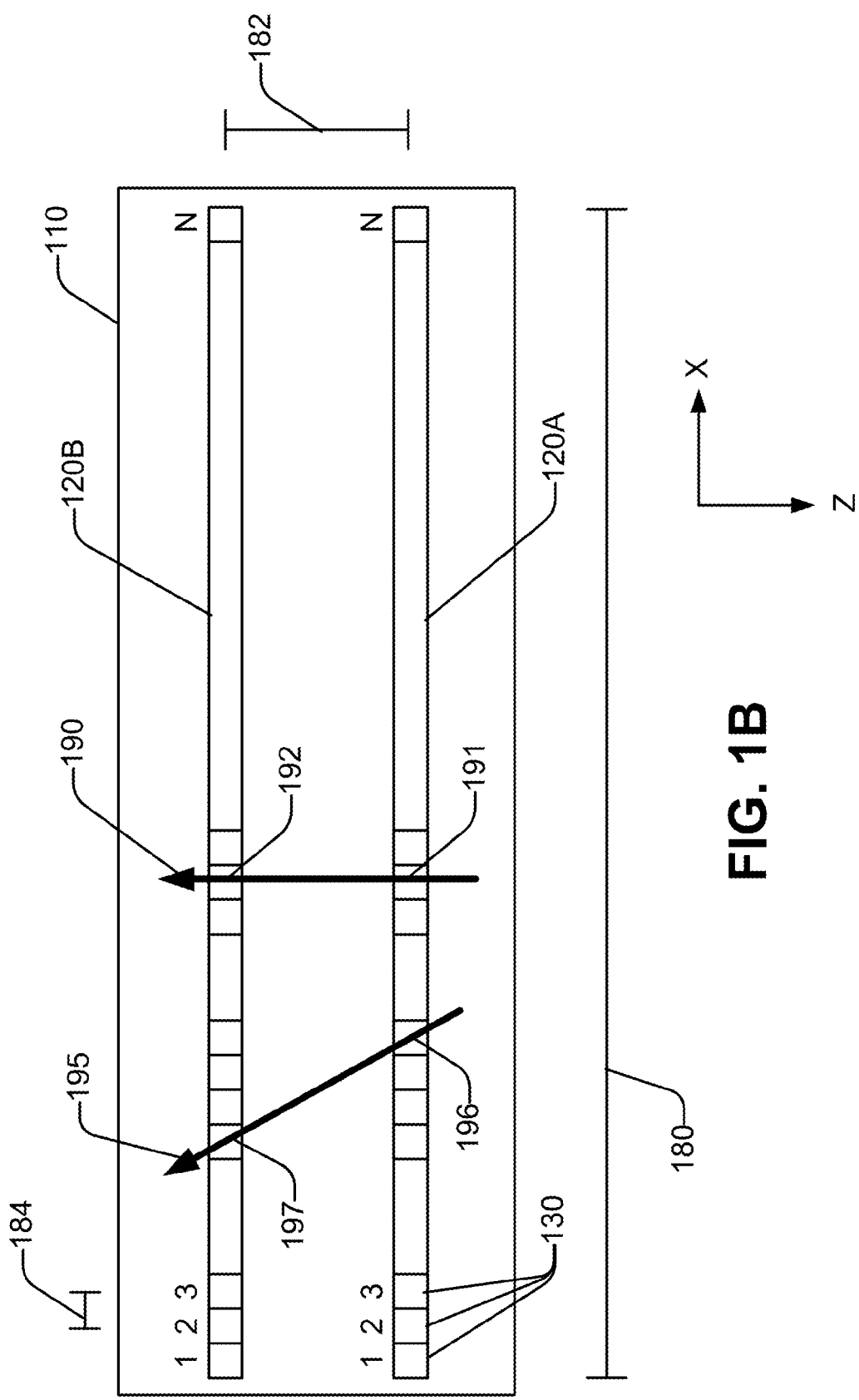

Trajectory error in the determined direction may be denoted in a number of ways, such as in one example an angle of deviation from the normal or intended trajectory in the error direction (i.e. the X direction in FIGS. 1A-1B), or a ratio of the distance of deviation in the error direction (i.e. the X direction in FIGS. 1A-1B) to the distance of travel in the direction of the intended trajectory (i.e. the Z direction in FIGS. 1A-1B).

Light from the illuminated drop 160 is projected by the lens 140 onto a range of sensor pixels 130 of a row 120 as image 150. Each pixel 130 can sense a different illumination intensity, with pixels 130 closer to the center of projected image 150 having a higher intensity and those near the edges of image 150 having a lower intensity for example. In some examples trajectory error measurements are performed while the sensor assembly 100 is moving in a direction along the length of pixel rows 120 (i.e. the X direction in FIGS. 1A-1B), which causes the image 150 to be blurred on the sensor 110 and thus elongated in this direction.

For purposes of measuring trajectory error, a specific drop position along each row 120A, 120B of a drop 160 is assigned as the position corresponding to the centroid along the row 120 of the illumination intensities of the range of sensor pixels 130 which correspond to image 150. In other words, this position is the one where the total illumination intensity for the drop on both sides of the position is equalized. This technique for determining drop position is usable regardless of whether or not image blurring due to motion of the sensor assembly 100 occurs.

In FIG. 1 B, assume that the normal or intended trajectory of a drop from a particular nozzle 170 results in a centroid of illumination intensity at pixel 191 on row 120A and pixel 192 on row 120B that defines a path 190. However, the actual trajectory of the drop from the particular nozzle 170 results in a centroid of illumination intensity at pixel 196 on row 120A and pixel 197 on row 120B that defines a path 195. Thus the trajectory error angle of the nozzle 170 in the direction measured by the sensor 110 may be calculated as the arctan of the difference in distance along the rows 120 between pixels 196, 197 divided by the spacing 182 between rows. Where, as in FIG. 1B, the axis of the rows corresponds to the X direction and the spacing between rows to the Z direction, the trajectory error angle takes the formula:

$$\alpha = \arctan((x_{pixel\ 197} - x_{pixel\ 196})/Z_{spacing\ 182})$$

In some examples, due to manufacturing tolerances or other reasons, the sensor 110 may be slightly rotated in its plane (in this example, about the Y axis), such that the normal intended trajectory has a component in the X direction. In these examples, the effect of rotation of the position of the sensor 110 can be calibrated out.

The trajectory error for the nozzle 170 may be determined based on a single drop, or may alternatively be determined based on multiple drops. For example, the error may be determined as the average of the trajectory error for multiple drops, or the individual errors of each drop may be analyzed in another manner to determine the overall trajectory error for the nozzle. In one example, a burst of drops is ejected from the nozzle 170, with each drop being measured and analyzed. In one example, the burst may be up to 8 drops.

Figure 2:
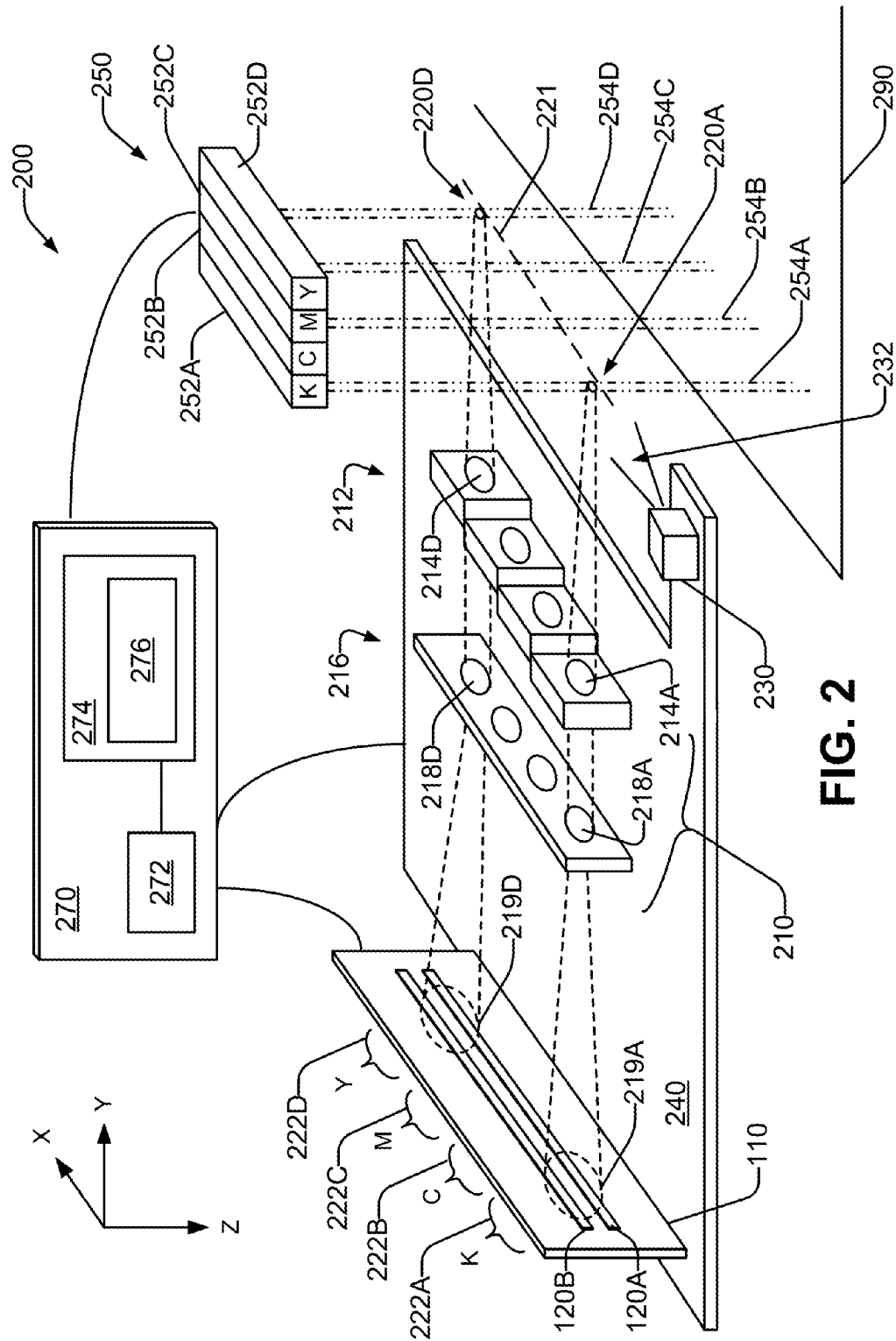
FIG. 2 is a schematic perspective representation of a printer having an imaging sensor assembly in accordance with an example of the present disclosure.
Figure 3:
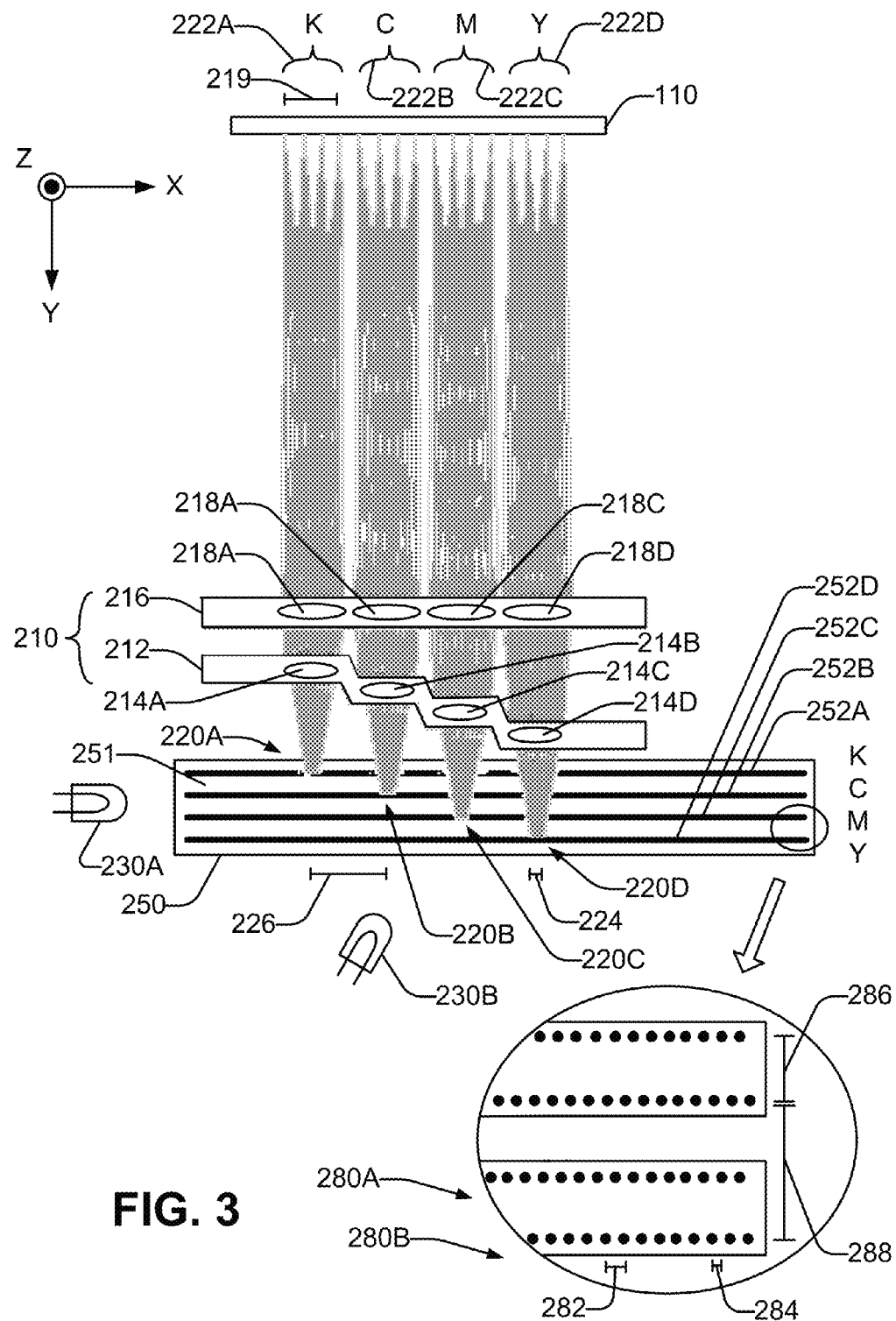
FIG. 3 is a schematic representation of another imaging sensor assembly in accordance with an example of the present disclosure usable in the printer of FIG. 2.

Considering now a printer having an imaging sensor assembly, and with reference to FIGS. 2 and 3, one example printer 200 includes an image sensor assembly that has a two-dimensional planar image sensor 110. FIG. 2 illustrates a schematic perspective view of the system 200, while FIG.

3 illustrates a two-dimensional view of the system 200 looking into the nozzle plane 251 of the printhead 250 (i.e. drops would be ejected up out of the plane of the page). The image sensor assembly includes the sensor 110 and a lens 210. In some examples the image sensor assembly may also include a light source 230, while in other examples the light source 230 may be a separate element of the printer 200. The printer 200 also includes a movable carriage 240, a printhead 250 and a controller 270. Drops may be controllably ejected from the printhead 250 towards a surface 290, which may in some examples be a print medium, a platen of the printer, an ink receptacle, or an aerosol fan. The image sensor assembly includes the sensor 100, the lens 210, and the light source 230.

The printhead 250 includes at least two linear nozzle arrays 252 arranged in parallel. Four linear nozzle arrays 252 are illustrated in FIGS. 2-3: a nozzle array 252A that ejects drops 254A of black (K) ink, a nozzle array 252B that ejects drops 254B of cyan (C) ink, a nozzle array 252C that ejects drops 254C of magenta (M) ink, and a nozzle array 252D that ejects drops 254D of yellow (Y) ink. The KCMY inks in combination enable full-color printing. The linear nozzle arrays 252 are arranged in parallel, and form a nozzle plane of the printhead 250. As can be appreciated from FIG. 3, each nozzle array 252A-D is positioned at a different distance from the plane of the sensor 110. The nozzles are controllable to eject liquid drops towards the surface 290 as instructed by the controller 270.

FIG. 3 includes an enlarged view of a portion of the two nozzle arrays 252C-D that further illustrates the structure of the example printhead 250. As explained heretofore, each nozzle array 252 is a logical linear array of nozzles. A logical linear nozzle array at a given resolution may be structured as two rows 280A-B of nozzles at half that resolution, where the two are offset in the direction of the row by the distance of one-half of the nozzle-to-nozzle spacing. In one example, the nozzle spacing 282 along each row 280A-B is at 600 dots per inch (dpi) or 42.34 micrometers, which in turn makes the effective spacing 284 of the logical nozzle array equal to 1200 dpi or 21.17 micrometers. In addition, the two rows 280A-B of a nozzle array 252 are separated by a distance 286, while adjacent nozzle arrays 252 are spaced at a distance 288. In one example, the distance 286 may be 210 micrometers, and the distance 288 may range between 0.5 and 2.0 millimeters.

The lens 210 is positioned between the sensor 110 and the flight trajectory of drops ejected from the printhead 250. The lens 210 includes a front optic 212 and a rear optic 216. The rear optic 216 includes at least 2 rear lenslets 218. The front optic 212 includes at least 2 front lenslets 214. FIGS. 2 and 3 illustrate four front lenslets 214A-D and four corresponding rear lenslets 218A-D. Each pair of front 214 and rear 218 lenslets are structured to have a different focal distance from the plane of the sensor 110 to the point of focus on the trajectory of drops ejected from the printhead 250. In this regard, the position of the front lenslets 214 are stepped (i.e. offset in the Y direction) such that each front lenslet 214 A-D is spaced at a different distance from its corresponding rear lenslet 218A-D. The different distance between each front 214 and rear 218 lenslet pair defines a different fixed focal distance for each lenslet pair 214, 218. Each fixed focal distance corresponds to the distance from the plane of the sensor 110 to the field of view 220A-D along the drop trajectories at which the drops ejected from a corresponding nozzle array 252A-D are imaged. The difference in focal distances from one lenslet pair 214, 218 to the next corresponds to the spacing 288 between the nozzle arrays 252. In one example, each lenslet pair 214, 218 provides at the sensor 110 a 4:1 magnification of the image drops.

Each lenslet pair 214, 218 of the lens 210 has a field of view 220 that simultaneously images (i.e. projects onto the sensor 110 images of) drops that have been ejected from multiple spaced-apart nozzles of the corresponding linear nozzle array 252. This operation may be referred to as "multiplexing". In multiplexing operation, an intended trajectory of each of the ejected drops are at a same distance from the plane of the sensor 110 along an axis orthogonal to the plane of the sensor 110 (i.e. in the Y direction). In one example, four drops simultaneously ejected from nozzles of a given array 252 that are spaced apart at an interval of nine nozzles are simultaneously imaged on the sensor 110. In another example, up to ten drops may be simultaneously ejected from nozzles of the given array 252. The multiple nozzles are imaged onto different non-overlapping positions along each row 120A-B within a single one of the regions 222 (i.e. 222A, B, C, or D) of the sensor 110. Each region 222 corresponds to a different lenslet pairs 214, 218. In the example where four drops are simultaneously ejected from nozzles of a given array 252 that are spaced apart at an interval of nine nozzles, the field of view 220 of a lenslet pair 214, 218 spans a sufficient distance to image drops from all four nozzles simultaneously. In one example, two of the drops are imaged near the edge of the field of view, and thus the span 224 of the field of view 220 is at least three times the distance between the drops (i.e. three times the spacing between nine nozzles). In an example where each lenslet pair 214, 218 provides a 4:1 magnification, the span 226 on the sensor rows 120A, 120B of the projected image 219 (two projected images 219A, 219D instead of all four are illustrated in FIG. 3 for clarity) is four times the span 224 of the field of view 220. To ensure that the projected images 219 for the four lenslet pairs 214A-D, 218A-D do not over lap on the sensor rows 120A, 120B, the center-center spacing 228 between adjacent fields of view 220 is the same or greater than the distance of the span 226. To achieve the spacing 228, the nozzles from which drops are ejected at a given time are different for each of the nozzle arrays 252A-D. The fields of view 220A-D are at the same position 221 along the Z axis.

In operation, each lenslet pair 214, 218 receives non-collimated light reflected from drops at lenslet 214, transmits collimated light from lenslet 214 to lenslet 218, and lenslet 218 then focuses non-collimated light onto the sensor 110.

Furthermore, at least two different lenslet pairs 214, 218 each simultaneously image multiple drops from different linear nozzle arrays 252 (viewed at different fields of view 220) onto different corresponding and non-overlapping regions 222 of the sensor 110. This may be referred to as "multichannel" operation. In multichannel operation, an intended trajectory of the ejected drops are at different distances from each other along an axis orthogonal to the plane of the sensor 110 (i.e. in the Y direction). In one example, lenslet pair 214A, 218A images drops (viewed at field of view 220A) onto region 222A; lenslet pair 214B, 218B images drops (viewed at field of view 220B) onto region 222B; lenslet pair 214C, 218C images drops (viewed at field of view 220C) onto region 222C; and lenslet pair 214D, 218D images drops (viewed at field of view 220D) onto region 222D. The two rows 120A, 120B of the image sensor 110 have a length sufficient to ensure that multiple drops from a given array 252 can be imaged on non-overlapping positions on the rows, and that drops from different nozzle arrays 252 can be imaged on different non-overlapping regions 222. As has been discussed heretofore, the drops ejected from one array 252 can be a different substance or a different color from the drops ejected from a different array 252.

The carriage 240 is spaced apart from the nozzle plane 251 in the Z direction. The sensor 110, lens 210, and light source 230 are mounted to, or otherwise disposed on, the carriage 240. The carriage is movable along the X axis. The motion control mechanism (not shown for clarity of illustration) may include a belt drive, gear drive, or other mechanisms suitable for moving the carriage 240. The carriage 240 is movable a sufficient distance to allow all of the nozzles in all of the arrays 252A-D to be measured by the sensor 110 for nozzle health including trajectory error. The trajectory error measured in this example is in the direction along the X axis.

Where the image sensor 110 is positioned parallel to the nozzle arrays 252 (i.e. both extending along the same direction; X in this case)

The light source 230 may be a divergent or collimated light source in the image sensor assembly, or disposed on the carriage 240, at a position that continuously illuminates 232, within a field of view 220 of the lens 210 and thus of the sensor 110, each ejected drop as the drop travels along its trajectory. In other words, all of the drops that are simultaneously ejected from the multiple nozzle arrays 252A-D at each of the different times are concurrently and continuously illuminated while the drops are within the corresponding field of view 220A-D. As discussed subsequently with reference to FIG. 4, the carriage 240 may be moved at a predetermined velocity during trajectory error measurements, and the various times of drop ejection and drop trajectory measurement are coordinated with this movement.

In one example, the light source 230 may be a simple LED. One example LED has a small divergence, or beam spread, that is sufficient to cover, with some small margin, the area where the ink drops ejected from the nozzles are imaged (i.e. the area of fields of view 220A-D). The LED also has sufficient power such that the light scattered by the drop can be sensed by the linear array. In one example, the LED has a power in the range of 50 to 150 milliwatts. Osram is one manufacturer of such suitable LEDs. The light source 230 is positioned such that all of the simultaneously ejected drops from all of the printhead slots 252A-D can be simultaneously illuminated.

In one example, a light source 230A is positioned on the carriage 240 at a position in the Y direction that falls within the same range of positions in the Y direction as the nozzle plane 251. In this case, the carriage 240 may move the light source 230A between the printhead 250 and the surface 290 (i.e. "underneath" the printhead 250). In another example, a light source 230B is positioned on the carriage 240 at a position in the Y direction that is greater than the range of positions in the Y direction that the nozzle plane 251 occupies. In this case, the carriage 240 does not move the light source 230A between the printhead 250 and the surface 290 (i.e. not "underneath" the printhead 250), but rather "alongside" the printhead 250. Both the positions of light source 230A, 230B allow simultaneous and continuous illumination of the drops as has been described. The position of light source 230A may be advantageous because in some examples the light source 230A can be disposed in the printer at a fixed position at one side of the printhead 250 rather than on the movable carriage 240. The position of light source 230B may be advantageous because more scattered light is directed to the sensor 110.

The controller 270 is communicatively coupled to the printhead 240, the sensor 110, and the carriage 240 (i.e. the carriage motion control). The controller 270 moves the carriage 240 while simultaneously ejecting drops from plural nozzles of the printhead 250 at each of plural times. The controller 270 may accomplish this by instructing the motion control mechanism of the carriage 240 to move, and instructing the printhead 250 when to eject drops from which nozzles of which nozzle array 252. As a result, in some examples the drop image may be blurred on the sensor due to the motion of the carriage 240. The controller 270 also calculates a trajectory error for each nozzle from the illumination intensities that are sequentially detected by each of the rows for each of the ejected drops. The term "sequentially detected" refers to a given drop being imaged first on one sensor row 120, and then on the other sensor row 120, as the drop travels along its trajectory. The controller 270 advantageously calculates the trajectory error of at least all non-end nozzles of the printhead 250 in a single pass of the carriage 240 relative to the printhead 250. In doing so, as discussed subsequently with reference to FIG. 4, the skip pattern utilized by the controller 270 takes into account the ejection frequency of the printhead nozzles, the speed of the carriage motion, the image blurring caused by sensor measurements taken during the carriage motion, the measurement cycle of the sensor 110, and the non-overlapping of drop images on the sensor 110. In other words, for each linear array 252 of nozzles in the printhead 250, the controller 270 determines the plural nozzles and the plural times according to a skip pattern which prevents overlap of multiple drop images on the sensor 110 during carriage motion, and which allows trajectory measurement of at least the non-end nozzles of the printhead 250 to be determined in a single pass.

The controller 270 may be implemented in hardware, firmware, software, or a combination of these technologies. In some examples, the controller 270 may include a processor 272 communicatively coupled to a memory 274. The memory 274 may include firmware and/or software 276, which includes machine readable instructions executable by the processor 272 to perform the functions and operations described herein.

Figure 4:
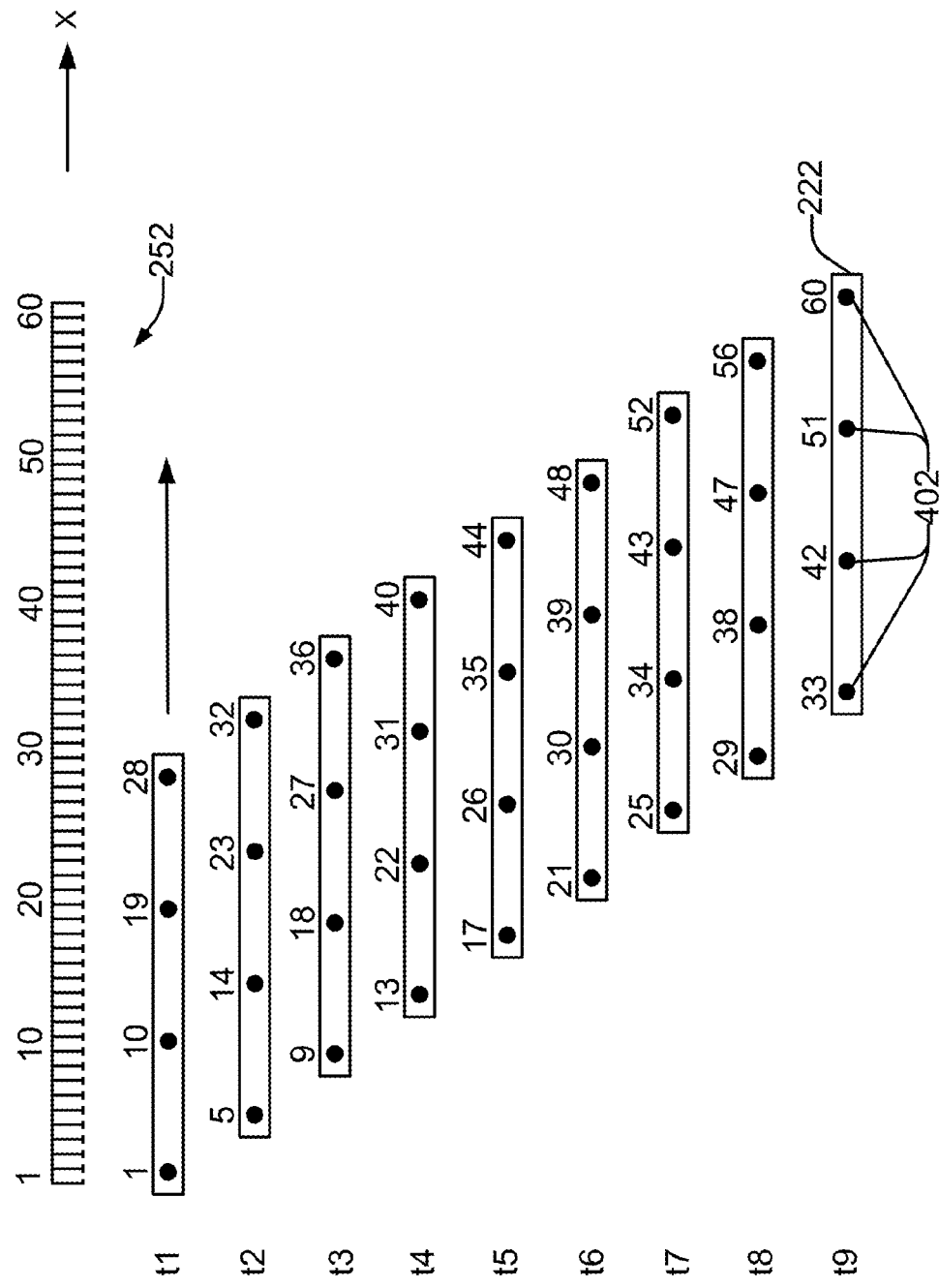
FIG. 4 is a schematic representation in accordance with an example of the present disclosure of the operation of an imaging sensor assembly in a printer.

Considering now one example of the operation of an imaging sensor assembly in a printer, which may be the printer 200, and with reference to FIG. 4, as previously noted a skip pattern algorithm may be used by a controller of the printer to coordinate the carriage motion, the printhead drop ejection, and the sensor measurement in such a manner as to ensure non-overlap of ejected drop images on the sensor. In some examples, there may be limits to the range of speeds achievable by the carriage, an upper limit on the drop ejection frequency of the printhead, a predetermined length of the rows of the sensor, an upper limit on the measurement frequency of the sensor, and a maximum expected trajectory error of the nozzles. Based at least on these constraints, and in order to measure the health (including trajectory error) of all non-end nozzles of the printhead during a single pass of the carriage, a skip pattern is defined. The skip pattern specifies (a) the number of nozzles in a single printhead nozzle array from which drops are to be simultaneously ejected and a short time later simultaneously imaged on and measured by the sensor; (b) the spacing interval for these operated nozzles; and (c) the number of nozzles in the printhead array that will be skipped over when making the next ejection/measurement operation.

As an example, in one implementation a printhead 250 as illustrated in FIG. 3 has logical nozzle array effective nozzle spacing 284 along each row 280A-B of 21.17 micrometers (1200 dpi). Also, the sensor 110 may have a measurement cycle time of 1.3 milliseconds. In order to move the position of a certain range of pixels of the image sensor 110 from one nozzle to its adjacent nozzle during the measurement cycle time (so that after the first measurement cycle was complete the image sensor 110 would be ready to measure that adjacent nozzle), the carriage 240 may travel at a velocity of about 0.64 inches per second (ips). However, in one implementation the carriage 240 may be capable of faster movement, up to 3.0 ips maximum. Moving the carriage 240 more rapidly is advantageous (providing that all the nozzles of a printhead nozzle array 252 can be measured at the increased carriage velocity) since it reduces the amount of time taken for the sensor to traverse and measure all the nozzles of the printhead nozzle array 252. At the maximum carriage velocity, a distance equivalent to the span of 4.69 nozzles may be traversed per measurement cycle. However, in order to measure all nozzles of the array 252 while the carriage is continuously moving at the selected constant velocity, the velocity is limited to the largest integer multiple of the nozzle-to-nozzle velocity that is supported by the carriage 240. Therefore, a carriage velocity of 2.56 ips, which corresponds to traversing four nozzles during each measurement cycle, is selected. Thus a "skip count" of four is assigned; in an implementation where nozzle #25 is imaged by the certain range of pixels during one measurement cycle, nozzle #29 will be imaged by those pixels during the next cycle, nozzle #33 during the following cycle, and so on.

In order to allow the three intermediate nozzles (e.g. nozzles #26, #27, and #28) which have been skipped to still be measured in a single pass, drops from multiple nozzles of a given printhead nozzle array 252 are imaged by the sensor 110 at the same time. The number of multiple nozzles chosen for simultaneous imaging depends on, among other factors, the length of the sensor rows 120, the magnification of the lens 210 (which determines the size on the sensor 110 of an imaged drop), the amount of blur introduced by the carriage motion, and the aerosol generated during drop ejection. At 2.56 ips, about 82.0 micrometers of motion blur occurs per drop in the field of view 220, which translates to about 328 micrometers of blur per drop on the sensor 110 when magnified 4:1 by the lens 210. In one example, four drops are imaged simultaneously based on the limits of the optic field of view 220 which corresponds to the size and magnification of the components (i.e. the lenslet pairs 214, 218) of the lens 210. To keep the image sensor assembly as small as possible, the imaged field of view of the nozzles should not be larger than the aperture of the lens. The lens diameters are constrained by the space that is available under, or around, the print zone of the printhead 250. Thus an optic aperture size and magnification can be chosen which allow four nozzles to be imaged on the sensor 110 at the same time without overlap.

Once the number of drops that are to be simultaneously imaged on the sensor 110 for a nozzle array 252 has been determined, the nozzle interval corresponding to each drop is determined according to the formula:

Nozzle interval=Number of simultaneous imaged drops*2+1

Therefore, for four simultaneously imaged drops, a nozzle interval of nine drops is utilized. In other words, a drop may be ejected from every ninth nozzle in the nozzle array 252. For example, during one measurement cycle, drops from nozzles #1, #10, #19, and #28 may be simultaneously ejected and imaged, and their trajectory error measured.

The example of FIG. 4 illustrates, for the first 9 measurement cycles (t1 through t9) and the first 60 nozzles of a single printhead nozzle array 252, the position in the X direction of the sensor 110 along the length of the nozzle array 252, the nozzles of the array 252 from which drops are ejected, and the drops as imaged 402 on one region 222 of the sensor 110. At the start of the measurement cycle t1, the carriage 240 begins continuously moving at the selected constant velocity and drops from nozzles #1, #10, #19, and #28 are imaged on the sensor 110 and measured. At the completion of that first measurement cycle, the carriage 240 has moved the sensor 110 to the position shown for t2, and drops from nozzles #5, #14, #23, and #32 are imaged on the sensor 110 and measured. This process is repeated for measurement cycles t3 through t9.

It can be observed that, beginning with cycle t7, the trajectory error of every nozzle from #25 to #36 has been measured. Nozzles #37 to #60 (and higher-numbered nozzles) may all be measured as subsequent measurement cycles occur. It can also be observed that some nozzles near the end of the nozzle array 252 are not measured in this process, specifically nozzles #2-4, #5-8, #11-12, #15-16, #20, and #24. A similar situation exists for a complementary set of nozzles at the other end (not shown) of the nozzle array 252. For nozzles in these end portions of the nozzle array 252 where fewer than all of the nozzles are measured, a modified trajectory error process may be used. In one example, the carriage velocity may be slowed to the 0.64 ips speed and nozzles of the end portion sequentially measured. In another example, the carriage 240 may make multiple passes in the end portions. Where the printhead nozzle array 252 includes a relatively large number of nozzles, the effect on the measurement throughput of the entire printhead array 252 due to the use of a different measurement technique for the end portions is negligible. For a one inch long 1200 dpi nozzle array having 1200 nozzles, the modified measurement technique would be used for about 4% of the nozzles. For a six inch long array with 7200 nozzles, the modified measurement technique would be applied to about 0.7% of the nozzles.

It is noted that FIG. 4 illustrates the measurement operation for a single nozzle array 252. As discussed previously with reference to FIGS. 2-3, drops from four channels (i.e. the four nozzle arrays 252A-D) are simultaneously imaged on different regions 222 of the sensor 110. As a result, 16 drops from 16 different nozzles (4 drops per nozzle array 252) of the printhead 250 can be simultaneously imaged every 1.3 milliseconds. This equates to 12,307 total nozzles/second. A nozzle array of over 220,000 nozzles can thus be tested in about 18 seconds. This is a 40 to 60 times performance increase over other trajectory error measurement techniques.

Figure 5:
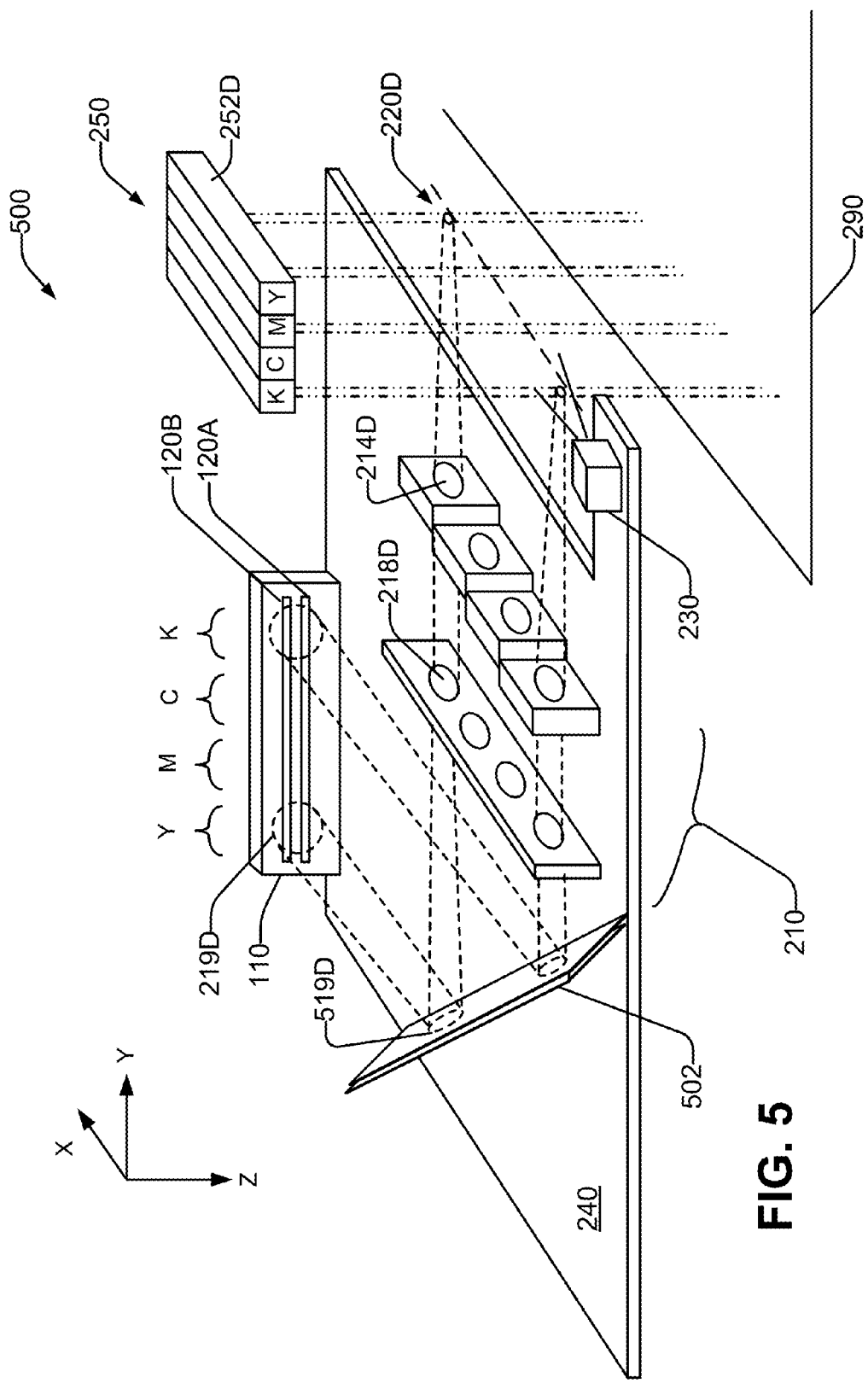
FIG. 5 is a schematic perspective representation of a printer having another imaging sensor assembly in accordance with an example of the present disclosure.

Considering now another printer having an imaging sensor assembly, and with reference to FIG. 5, an example printer 500 includes a folding mirror 502 in its imaging sensor assembly. Like the printer 200, the printer 500 includes an imaging sensor 110, a lens 210, a light source 230, a carriage 240, a printhead 250, and a controller (not shown). The mirror 502 is disposed on the carriage 240 at an angle relative to the projected drop image by the rear optics 218 so as to reflect the drop image in a different direction. In one example, the angle relative to the drop image is substantially 45 degrees, and the drop image is deflected by substantially 90 degrees in the X-Y plane.

The mirror 502 can advantageously allow the imaging sensor assembly to be made more compact; to assume a different form factor than the imaging sensor assembly of FIG. 2; and/or to have a longer focal distance from the front lenslet 214 to the drop in the field of view 220. Parameters of the lens 210 and the imaging sensor 110 may be modified or adjusted to accommodate the mirror 502. For example, the focal lengths of the front 214 and/or rear 218 lenslets, or their magnifications, may be modified. For the imaging sensor 110, the length of the rows 120A, 1208, and/or the spacing between the rows 120A, 1208, may be modified.

Figure 6:
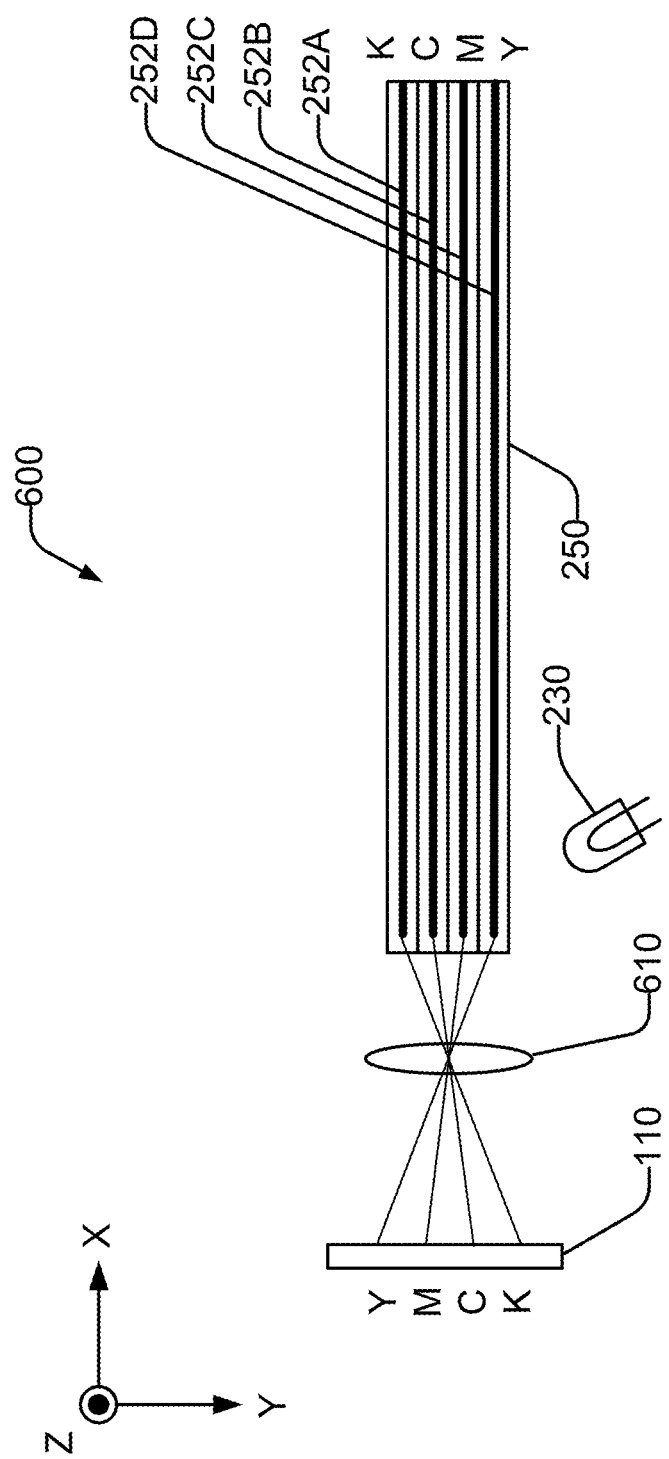
FIG. 6 is a schematic representation of a printer having another imaging sensor assembly of a printer in accordance with an example of the present disclosure.

Considering now another printer having an imaging sensor assembly, and with reference to FIG. 6, an example printer 600 includes an imaging sensor assembly for measuring nozzle health including trajectory error. The trajectory error measured in the system 600 is in the direction along the Y axis, rather than in the direction along the X axis as is measured in the printer 200 (FIGS. 2-3) and the printer 500 (FIG. 5). The imaging sensor assembly includes a sensor 110 having two spaced-apart rows of imaging pixels, a lens 610, and a light source 230. The printer also includes a printhead 250 having multiple nozzle arrays 252, a carriage (not shown), and a controller (not shown).

The lens 610 has a single optic that simultaneously images drops ejected from all of the different printhead nozzle arrays 252A-D. The trajectories of the drops ejected from nozzles of each array 252A-D are all at the same focal distance in the field of view of the lens 610. In some examples, drops are simultaneously ejected from the same nozzle number of each nozzle array 252A-D. Each drop image is projected by the lens 610 onto a different region of the imaging sensor 110. The position of light source 230 projects light to allow simultaneous and continuous illumination of the drops from all the nozzle arrays 252A-D.

During a measurement operation, the carriage moves the imaging sensor assembly along the direction of the X axis. At least the sensor 110 and the lens 610 of the assembly are moved by the carriage between the printhead 250 and a surface (not shown; located above the plane of the page of FIG. 6) towards which the drops are directed (i.e. the sensor 110 and lens 610 are moved "underneath" the printhead 250). The measurement operation is multichannel, but not multiplexing: drop(s) are ejected from one nozzle of each nozzle array 252A-D during each measurement cycle. The carriage velocity is coordinated with the measurement cycle time such that drops measured in the next measurement cycle are ejected from the next nozzle number in each of the arrays 252A-D. Thus a skip pattern algorithm as described heretofore is not utilized. In this way, the health of all nozzles of the printhead 250 can be ascertained in a single pass.

Figure 7:
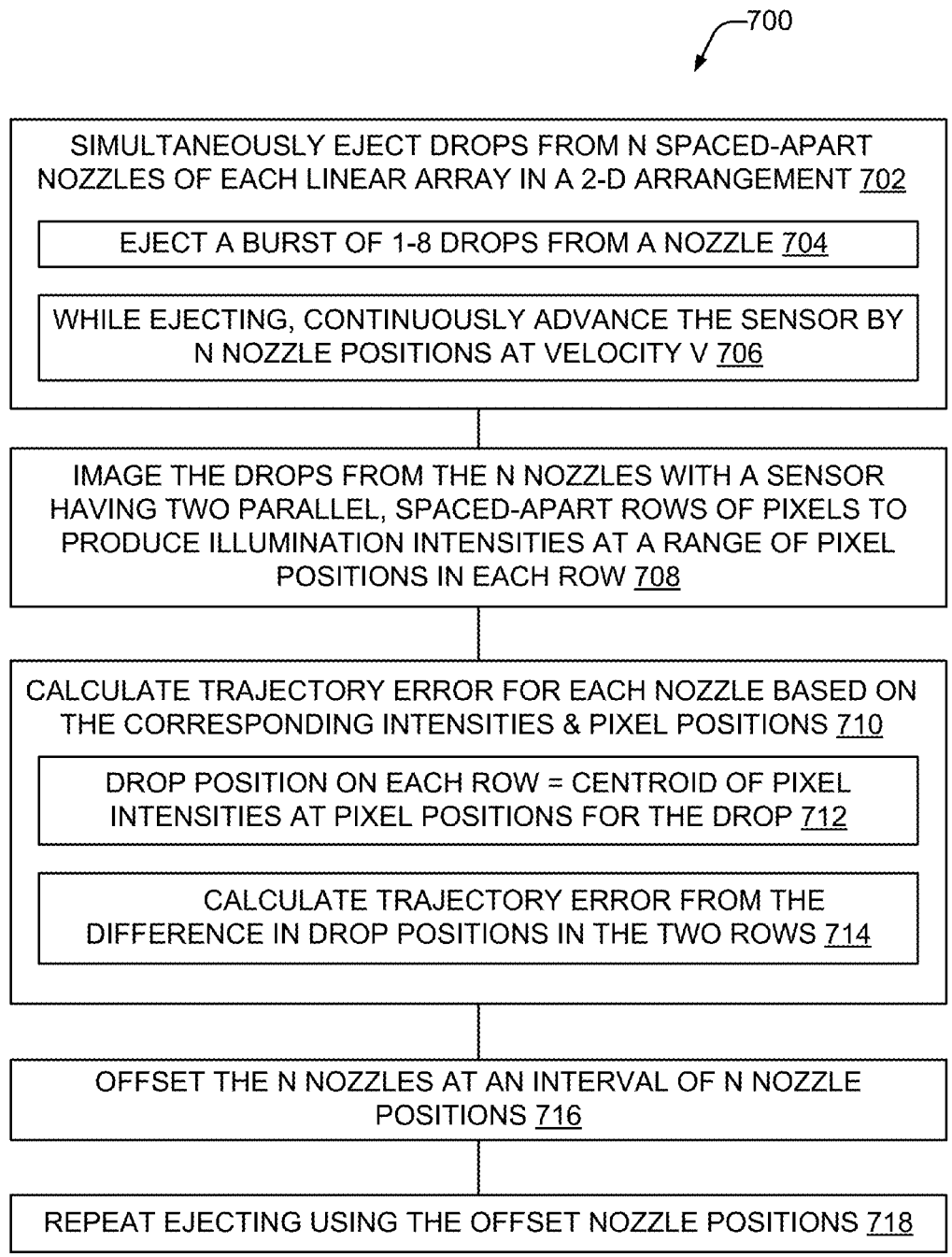
FIG. 7 is a flowchart in accordance with an example of the present disclosure of a method of measuring nozzle health in a printer.

Consider now, with reference to FIG. 7, a flowchart of one example method of a method 700 of measuring nozzle drop health in a printer. Alternatively, some or all of the flowchart of FIG. 7 may be considered as steps in a method 700 implemented by a controller in the printer, such as the controller 270 (FIG. 2).

At 702, drops are simultaneously ejected from N spaced-apart nozzles of each of the linear arrays in a two-dimensional arrangement of parallel linear arrays of drop-ejecting nozzles. The N nozzles may be equally spaced apart at an interval of 2*N+1 nozzle positions. In one example, at 704, a burst of up to 8 drops is ejected from a given nozzle. In one example, at 706, a sensor having two parallel, spaced-apart rows of imaging pixels is continuously advanced along the length of the plural linear arrays at a velocity V by a distance corresponding to N nozzle positions during the ejecting.

At 708, the drops ejected from the N nozzles of each of the linear arrays are imaged with the sensor, each imaged drop producing illumination intensities at a range of pixel positions along each row. The drops may be imaged substantially simultaneously. The value of N ensures that the imaged drops do not overlap on the sensor when the sensor is continuously advanced at a velocity V At 710, a trajectory error is calculated for each nozzle based on the illumination intensities and the pixel positions. In one example, at 712, a drop position along a row is determined as a centroid of illumination intensities of the imaged drop at the pixel positions along the row that correspond to the imaged drop. In one example, at 714, the trajectory error for the corresponding nozzle is calculated based on a difference in the drop positions along the two rows for the drop(s) ejected from that nozzle.

At 716, the N nozzles are offset at an interval of N nozzle positions in the direction of the advance, and at 718 the simultaneous ejecting is repeated using the N nozzles located at the offset nozzle positions.

From the foregoing it will be appreciated that the imaging sensor assembly, printer, and method provided by the present disclosure represent a significant advance in the art. Although several specific examples have been described and illustrated, the disclosure is not limited to the specific methods, forms, or arrangements of parts so described and illustrated. For example, while the disclosure describes a skip pattern algorithm which can be used to test all nozzles in a single pass of the sensor assembly with respect to the printhead, in other examples a different skip pattern and multiple passes of the sensor assembly with respect to the printhead may be used to test all the nozzles in order to reduce, minimize, or eliminate the adverse effects of aerosol in the printer. Terms of orientation and relative position (such as "top," "bottom," "side," and the like) are not intended to require a particular orientation of any element or assembly, and are used only for convenience of illustration and description. This description should be understood to include all novel and non-obvious combinations of elements described herein, and claims may be presented in this or a later application to any novel and non-obvious combination of these elements. The foregoing examples are illustrative, and no single feature or element is essential to all possible combinations that may be claimed in this or a later application. Unless otherwise specified, steps of a method claim need not be performed in the order specified. Similarly, blocks in diagrams or numbers (such as (1), (2), etc.) should not be construed as steps that must proceed in a particular order. Additional blocks/steps may be added, some blocks/steps removed, or the order of the blocks/steps altered and still be within the scope of the disclosed examples. Further, methods or steps discussed within different figures can be added to or exchanged with methods or steps in other figures. Further yet, specific numerical data values (such as specific quantities, numbers, categories, etc.) or other specific information should be interpreted as illustrative for discussing the examples. Such specific information is not provided to limit examples. The disclosure is not limited to the above-described implementations, but instead is defined by the appended claims in light of their full scope of equivalents. Where the claims recite "a" or "a first" element of the equivalent thereof, such claims should be understood to include incorporation of one or more such elements, neither requiring nor excluding two or more such elements.

What is claimed is:

1. An imaging sensor assembly, comprising:
   a two-dimensional imaging sensor having two parallel, spaced-apart rows of imaging pixels, each pixel producing a multilevel signal indicative of an illumination intensity impinging that pixel; and a lens projecting an image of a drop ejected from a printhead onto the rows sequentially as the drop travels along a trajectory, wherein the projected image of the drop impinges a plurality of adjacent pixels on a given row, and wherein a position of the drop along the given row is defined as a centroid of the intensity values for the adjacent pixels.

2. The imaging sensor assembly of claim 1, wherein the pixels of each row are disposed along that row at a resolution of at least 508 dots per inch.

3. The imaging sensor assembly of claim 1, wherein
the printhead simultaneously ejects drops from at least two different nozzles of the printhead, and
the lens simultaneously projects an image of each of the drops onto non-overlapping positions along each row.

4. The imaging sensor assembly of claim 3, wherein an intended trajectory of at least two of the drops are at different distances from each other along an axis orthogonal to a plane of the sensor.

5. The imaging sensor assembly of claim 4, wherein the at least two of the drops are different substances from each other.

6. The imaging sensor assembly of claim 3, wherein an intended trajectory of at least two of the drops are at a same distance from a plane of the sensor along an axis orthogonal to the plane of the sensor.

7. The imaging sensor assembly of claim 1, wherein the lens comprises:
a rear optic having at least two rear lenslets; and
a front optic having at least two front lenslets, each front lenslet corresponding to a different one of the rear lenslets, the front optics stepped such that each front lenslet is spaced at a different distance from its corresponding rear lenslet, the different distances defining a different fixed focal distance for each pair of front and rears lenslets.

8. A printer, comprising:
a carriage spaced apart from a nozzle plane of a printhead controllable to eject drops, the carriage movable parallel to the nozzle plane along at least one linear array of nozzles in the plane;
a sensor on the carriage having two parallel spaced-apart rows of imaging pixels, each row sized to image a plurality of in-flight drops at a given time; and
a controller continuously moving the carriage while ejecting drops from the plurality of nozzles at each of a plurality of times, and calculating a trajectory error for a given nozzle based on illumination intensities for a corresponding drop, the intensities sequentially measured by each of the rows, a lens disposed between the sensor and the ejected drops and structured with a field of view that simultaneously images drops from a plurality of spaced-apart ones of the nozzles of a given linear nozzle array onto different positions within a single corresponding region of the sensor,
wherein the nozzle plane comprises at least two linear nozzle arrays in parallel, and wherein the lens comprises:
at least two lenslet pairs structured to each have a different focal distance, where each focal distance corresponds to a distance from the sensor to the ejected drops of a different one of the linear arrays.

9. The printer of claim 8, wherein each lenslet pair simultaneously images multiple drops from each different linear nozzle array onto a different corresponding region of the sensor.

10. The printer of claim 8, wherein the controller calculates the trajectory error of all nozzles of non-end portions of the printhead in a single pass of the carriage relative to the printhead.

11. The printer of claim 8 wherein, for each linear array of nozzles, the controller determines the plural nozzles and the plural times according to a skip pattern which prevents overlap of multiple drop images on the sensor during carnage motion.

12. The printer of claim 8, comprising:
a light source disposed on the carriage at a position which continuously illuminates all drops ejected at each plural time while the drops are within a field of view of the sensor.

13. The printer of claim 8, wherein
the nozzle plane of the printhead simultaneously ejects drops from at least two different nozzles, and
the lens simultaneously projects an image of each of the drops onto non-overlapping positions along each row of imaging pixels.

14. printer 13, wherein an intended trajectory of at least two of the drops are at different distances from each other along an axis orthogonal to a plane of the sensor.

15. The printer of claim 14, wherein the at least two of the drops are different substances from each other.

16. A method of measuring nozzle drop health in a printer having a two-dimensional arrangement of parallel linear arrays of printhead nozzles, comprising:
simultaneously ejecting drops from number N of spaced-apart nozzles of each of the linear arrays;
simultaneously imaging the drops from the N nozzles of each of the linear arrays with a sensor having two parallel, spaced-apart rows of pixels, each imaged drop producing illumination intensities at a range of pixel positions along each row; and
calculating a trajectory error for each nozzle based on the illumination intensities and the pixel positions for the corresponding drop, wherein the value of N ensures that the imaged drops do not overlap on the sensor when the sensor is continuously advanced at an associated velocity V.

17. The method of claim 16, wherein the N nozzles are equally spaced apart at an interval of 2*N+1 nozzle positions, the method further comprising:
while performing the simultaneous ejecting, continuously advancing the sensor along the length of the plural linear arrays by a distance corresponding to N nozzle positions;
offsetting he N nozzles at an interval of the N nozzle positions in the direction of advancing; and
repeating the simultaneous ejecting using the N offset nozzles.

18. The method of claim 16, wherein the calculating comprises:
determining a drop position along a row as a centroid of illumination intensities of the imaged drop at the pixel positions along the row which correspond to the imaged drop; and
calculating the trajectory error for the corresponding nozzle based on a, difference in the drop positions along the two rows.

19. The method of claim 16, wherein the ejecting comprises: ejecting a burst of up to 8 drops from a nozzle.

* * * * *

UNITED STATES PATENT AND TRADEMARK OFFICE
CERTIFICATE OF CORRECTION

PATENT NO. : 9,522,527 B2  
APPLICATION NO. : 15/027155  
DATED : December 20, 2016  
INVENTOR(S) : Stephan R. Clark et al.

Page 1 of 1

It is certified that error appears in the above-identified patent and that said Letters Patent is hereby corrected as shown below:

In the Claims

In Column 14, Line 9 approx., in Claim 11, delete "carnage" and insert -- carriage --, therefor.

In Column 14, Line 22 approx., in Claim 14, delete "printer" and insert -- The printer --, therefor.

In Column 14, Line 30 approx., in Claim 16, delete "from number" and insert -- from a number --, therefor.

In Column 14, Line 51 approx., in Claim 17, delete "he N" and insert -- the N --, therefor.

In Column 14, Line 62 approx., in Claim 18, delete "a, difference" and insert -- a difference --, therefor.

Signed and Sealed this  
Twelfth Day of September, 2017

Joseph Matal  
*Performing the Functions and Duties of the*  
*Under Secretary of Commerce for Intellectual Property and*  
*Director of the United States Patent and Trademark Office*